(12) United States Patent
Edmond et al.

(10) Patent No.: US 6,630,690 B2
(45) Date of Patent: Oct. 7, 2003

(54) GROUP III NITRIDE PHOTONIC DEVICES ON SILICON CARBIDE SUBSTRATES WITH CONDUCTIVE BUFFER INTERLAYER STRUCTURE

(75) Inventors: John Adam Edmond, Cary, NC (US); Hua-Shuang Kong, Raleigh, NC (US); Kathleen Marie Doverspike, Cary, NC (US); Michelle Turner Leonard, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 09/966,789

(22) Filed: Sep. 28, 2001

(65) Prior Publication Data

US 2002/0008241 A1 Jan. 24, 2002

Related U.S. Application Data

(63) Continuation of application No. 09/718,654, filed on Nov. 22, 2000, now Pat. No. 6,373,077, which is a continuation of application No. 08/944,547, filed on Oct. 7, 1997, now Pat. No. 6,201,262.

(51) Int. Cl.[7] .......................... H01L 27/15; H01L 31/12; H01L 33/00
(52) U.S. Cl. ................. 257/79; 257/9; 257/13; 257/21; 257/82; 257/90; 257/290; 257/292; 438/20; 438/22; 438/48; 438/39; 438/41; 372/39; 372/40; 372/43; 372/45
(58) Field of Search ............... 257/301, 9, 13–21, 257/29–89, 225–228, 290–292, 90; 148/33; 372/43–50; 438/20–22, 48, 39, 41

(56) References Cited

U.S. PATENT DOCUMENTS

| | | |
|---|---|---|
| 4,396,929 A | 8/1983 | Ohki et al. |
| 4,865,685 A | 9/1989 | Palmour |
| 4,981,551 A | 1/1991 | Palmour |
| 5,043,773 A | 8/1991 | Precht et al. |
| 5,393,993 A | 2/1995 | Edmond et al. |
| 5,432,808 A | 7/1995 | Hatano et al. |
| 5,523,589 A | 6/1996 | Edmond et al. |
| 5,578,839 A | 11/1996 | Nakamura et al. |
| 5,592,501 A | 1/1997 | Edmond et al. |
| 5,661,074 A | 8/1997 | Tischler |
| 5,972,730 A | * 10/1999 | Saito et al. .................. 438/39 |
| 6,492,193 B1 | * 11/2000 | Edmond et al. .............. 438/77 |
| 6,187,606 B1 | * 2/2001 | Edmond et al. .............. 438/46 |
| 6,201,262 B1 | * 3/2001 | Edmond et al. .............. 257/77 |
| 6,373,077 B1 | * 4/2002 | Edmond et al. .............. 257/77 |
| 6,377,596 B1 | * 4/2002 | Tanaka et al. ................ 372/45 |
| 6,459,100 B1 | * 10/2002 | Doverspike et al. .......... 257/97 |
| 2002/0008241 A1 | * 1/2002 | Edmond et al. .............. 257/77 |
| 2002/0121642 A1 | * 9/2002 | Doverspike et al. .......... 257/97 |
| 2003/0025121 A1 | * 2/2003 | Edmond et al. .............. 257/99 |

FOREIGN PATENT DOCUMENTS

| | | |
|---|---|---|
| EP | 0352472 A2 | 1/1990 |
| JP | 6-326416 A | 11/1994 |
| WO | WO 90/10950 A1 | 9/1990 |
| WO | WO 96/24167 A1 | 8/1996 |

* cited by examiner

*Primary Examiner*—Matthew Smith
*Assistant Examiner*—Granvill D Lee, Jr.
(74) *Attorney, Agent, or Firm*—Summa & Allan, P.A.

(57) ABSTRACT

An optoelectronic device with a Group III Nitride active layer is disclosed that comprises a silicon carbide substrate; an optoelectronic diode with a Group III nitride active layer; a buffer structure selected from the group consisting of gallium nitride and indium gallium nitride between the silicon carbide substrate and the optoelectronic diode; and a stress-absorbing structure comprising a plurality of predetermined stress-relieving areas within the crystal structure of the buffer structure, so that stress-induced cracking that occurs in the buffer structure occurs at predetermined areas rather than elsewhere in the buffer structure.

14 Claims, 8 Drawing Sheets

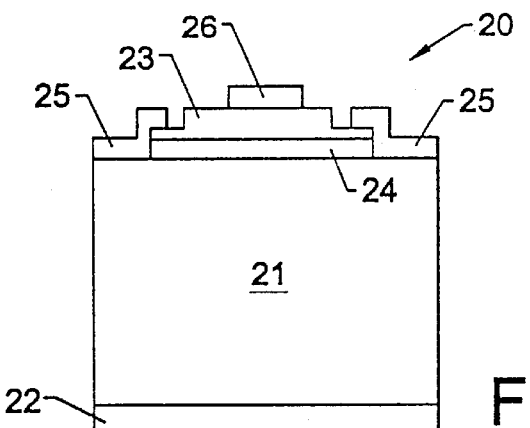
FIG. 1.
(PRIOR ART)
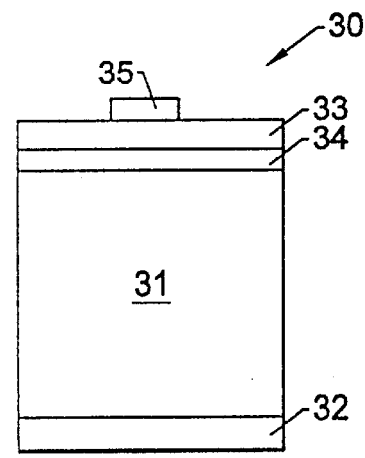
FIG. 2.
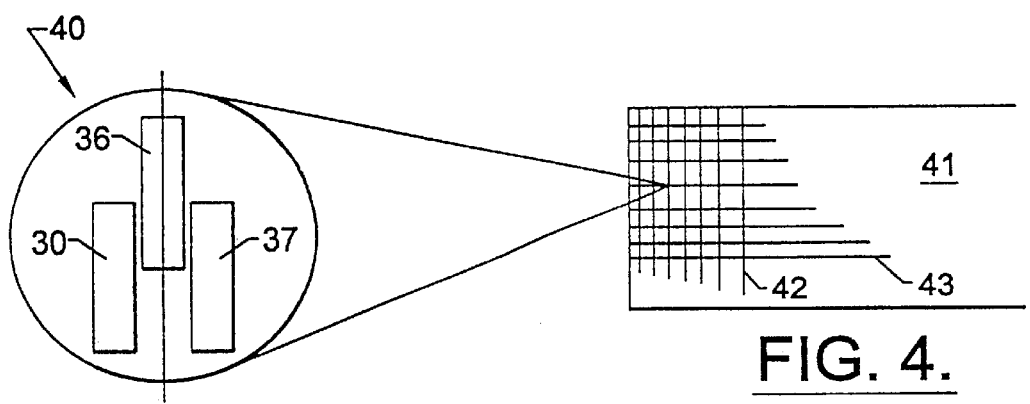
FIG. 3.
FIG. 4.

GROUP III NITRIDE PHOTONIC DEVICES ON SILICON CARBIDE SUBSTRATES WITH CONDUCTIVE BUFFER INTERLAYER STRUCTURE

CROSS-REFERENCE TO RELATED APPLICATION

This application is a continuation of Ser. No. 09/718,654 filed on Nov. 22, 2000, now U.S. Pat. No. 6,373,077, which is a continuation of Ser. No. 08/944,547 filed on Oct. 7, 1997 and now U.S. Pat. No. 6,201,262.

FIELD OF THE INVENTION

This invention relates to photonic devices in wide bandgap materials, and in particular relates to photonic devices formed with Group III nitride active layers on silicon carbide substrates.

BACKGROUND OF THE INVENTION

The semiconductor materials with wide bandgaps such as diamond, silicon carbide, and gallium nitride have become of significant interest in recent years because their wide bandgap characteristics provide them with the capability to emit light of higher energy (with correspondingly higher frequency and shorter wavelength) than do other semiconductor materials such as silicon or gallium arsenide. In particular, silicon carbide, gallium nitride, and certain other Group III nitrides have bandgaps large enough to produce visible light throughout the visible spectrum, including the higher-energy blue portion. They thus provide the basis for semiconductor lasers and light emitting diodes (LEDs) with blue and green emissions.

Of these materials, gallium nitride is of particular interest because it is a direct semiconductor, i.e., the transition from the valence band to the conduction band does not require a change in crystal momentum for the electron. As a result, the transition produces light very efficiently. In contrast silicon carbide is an indirect semiconductor; the bandgap transition energy is given off partly as a photon and partly as vibrational energy. Thus, gallium nitride offers the advantage that for a given operating voltage and current, it will produce light more efficiently than silicon carbide.

As with other semiconductor materials, however, the first step in forming a workable photonic devise is to build-up or otherwise obtain a suitable crystal structure with the desired active layer. Because of the differences in the structural characteristics of semiconductor materials, however, particularly their crystal lattice structures, the materials which will workably support Group III nitride active layer devices are somewhat limited.

Presently, commercially available structures for a light emitting diode photonic device are formed of a gallium nitride or related Group III nitride active layer on a sapphire substrate. Sapphire ($Al_2O_3$) provides a relatively close lattice match to Group III nitrides, but also suffers certain disadvantages, the most limiting of which is its electrically insulating character. Thus, when Group III nitride active and buffer layers (i.e., the intermediate layers that provide a crystal structure transition from the substrate to the active layer) are built on sapphire, the sapphire cannot be used as a conductive pathway to the active portions of the device. This limits the type of devices that can be designed and produced on sapphire, and in particular limits the ability to form "vertical" devices in which the device contacts can be placed on opposite surfaces of the device with a direct conductive path through the substrate, buffers, and active layer and the other contacts on the opposite of the device.

Accordingly, interest, including that of the assignee of the present invention, has focused upon the use of other materials as substrate candidates for Group III nitride photonic devices. Silicon carbide (SiC) is a particularly attractive candidate because it can be made conductive, has a lattice match that can be appropriately buffered to a Group III nitride active layer, and has excellent thermal and mechanical stability.

Nevertheless, silicon carbide's crystal lattice structure is such that some of the best candidates for an appropriate Group III buffer layer on a silicon carbide substrate are insulating rather than conductive. Thus, although the silicon carbide substrate can be made conductive, some of the preferred buffer layers between silicon carbide substrates and Group III active layer photonic devices remain insulating, thus minimizing the advantages of the conductive silicon carbide substrate.

For example, aluminum nitride (AlN) provides an excellent buffer between a silicon carbide substrate and a Group III active layer, particularly a gallium nitride active layer. Aluminum nitride is, however, insulating rather than conductive. Thus, structures with aluminum nitride buffer layers require shorting contacts that bypass the aluminum nitride buffer to electrically link the conductive silicon carbide substrate to the Group III nitride active layer. As noted above such shorting contacts preclude some of the more advantageous device designs.

Alternatively, conductive buffer layer materials such as gallium nitride (GaN), aluminum gallium nitride (AlGaN), or combinations of gallium nitride and aluminum gallium nitride can eliminate the shorting contacts. In turn, eliminating the shorting contact reduces the epitaxial layer thickness, decreases the number of fabrication steps required to produce devices, reduces the overall chip size, and increases the device efficiency. Accordingly, Group III nitride devices can be produced at lower cost with a higher performance.

Nevertheless, although these conductive buffer materials offer these advantages, their crystal lattice match with silicon carbide is less satisfactory than is that of aluminum nitride. Accordingly, when epitaxial buffer layers of gallium nitride, aluminum gallium nitride, or combinations thereof are grown on silicon carbide substrates, they tend to produce excessive cracking in subsequent epilayers that are required for photonic devices such as light-emitting diodes or laser diodes.

Thus, there exists a need for a buffer structure that offers the crystal lattice match advantages of aluminum nitride and yet which at the same time offers the conductivity advantages of gallium nitride or aluminum gallium nitride and that can be used in conjunction with conductive silicon carbide substrates rather than insulating sapphire substrates.

OBJECT AND SUMMARY OF THE INVENTION

Therefore, it is an object of the present invention to produce photonic devices and their wafer precursors, with a Group III nitride active layer, a conductive silicon carbide substrate, and a conductive buffer layer, but that avoids the cracking and other problems that have to date hindered such combinations of materials and layers.

The invention meets this object with a photonic device with a Group III nitride active layer which comprises a silicon carbide substrate, an optoelectronic diode with a Group III nitride active layer, and a buffer structure between the silicon carbide substrate and the optoelectronic diode in which the buffer structure is both conductive and which provides the appropriate crystalline properties.

In one aspect, the buffer structure is selected from the Group consisting of gallium nitride and indium gallium nitride (InGaN), and incorporates a stress absorbing structure comprising a plurality of predetermined stress relieving areas within the crystal structure of the buffer layer so that stress induced cracking that occurs in the buffer occurs at the predetermined areas rather than elsewhere in the buffer.

In another aspect, the buffer layer includes a plurality of discrete crystal portions selected from the group consisting of gallium nitride and indium gallium nitride on the surface of the silicon carbide substrate for minimizing or eliminating the heterobarrier between silicon carbide and aluminum gallium nitride buffer structure.

The foregoing, and other objects and advantages of the invention, and the manner of accomplishing the same will become clearer when taken in conjunction with the accompanying detailed description and drawings in which:

BRIEF DESCRIPTION OF THE DRAWINGS

FIG. 1 is a cross-sectional view of a prior-art diode with a shorting ring contact;

FIG. 2 is a cross-sectional view of a vertical diode that can be produced to the present invention;

FIG. 3 is an enlarged schematic view of a pixel formed according to the present invention;

FIG. 4 is a schematic view of a display that includes a parality of pixels that incorporates structures according to the present invention;

DETAILED DESCRIPTION

Figure 5:
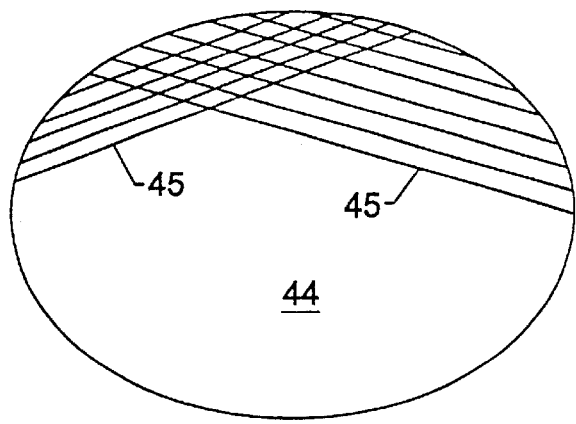
FIG. 5 is a schematic view of a silicon carbide wafer that incorporates the stress relieving structure according to the present invention.

FIG. 1 is a cross-sectional view of a prior art device that is broadly designated at 20. As illustrated in FIG. 1, the device 20 includes a silicon carbide substrate 21, a contact 22 to the "back" of the substrate 21, a Group III nitride active layer 23, a buffer layer 24 which is insulating rather than conductive, shorting contacts 25 for providing electrical contact between the conductive silicon buffer 21 and the active layer 23, and a top contact 26 for completing the circuit and permitting current to flow through the device in operation.

FIG. 2 shows the manner in which the present invention provides for a more compact device. In FIG. 2 the device is broadly designated at 30, and includes a conductive silicon carbide substrate 31, a back contact 32, an active layer 33 and a conductive buffer structure 34, along with a top contact 35. The invention thus eliminates the shorting contacts (typically shorting ring contacts) 25 of the device of FIG. 1. As a result, the device 30 is easier to manufacture and more efficient in operation. It will be understood that the active layer 33 as discussed herein can represent a device with a single p-n junction, a single or double p-n heterojunction or a p-n junction quantum well structure. Such structures are described in a number of prior U.S. patents including U.S. Pat. Nos. 5,393,993 and 5,592,501, and will not be otherwise discussed in detail herein other than to further illustrate the present invention.

FIG. 3 illustrates that the device 30 according to the present invention can be incorporated with similar devices of different emitting wavelengths, in particular a red emitting diode 36 and a green emitting diode 37, as part of a three-color pixel broadly designated at 40 which in turn can be one of a plurality of such pixels in a display 41. The vertical 42 and horizontal 43 lines shown schematically in FIG. 4 represent the rows and columns of pixels typically used in displays that incorporate light emitting diodes.

In its first aspect, the invention is a photonic device with a Group III nitride active layer that comprises a silicon carbide substrate 31, a photonic diode with a Group III nitride active layer 33, and a buffer structure 34 selected from the group consisting of gallium nitride and indium gallium nitride between the silicon carbide substrate 31 and the diode 33. In particular, the buffer structure includes a stress absorbing structure that is made up of a plurality of predetermined stress relieving areas within the crystal structure of the buffer structure 34 so that stress induced cracking that occurs in the buffer structure occurs at the predetermined areas rather than elsewhere in the structure.

Figure 6:
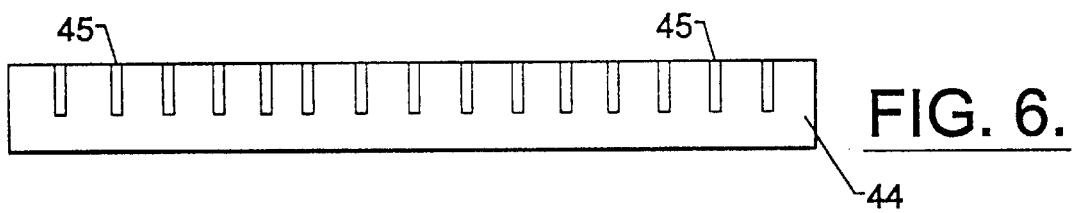
FIG. 6 is a cross-sectional view of the wafer of FIG. 5.
Figure 7:
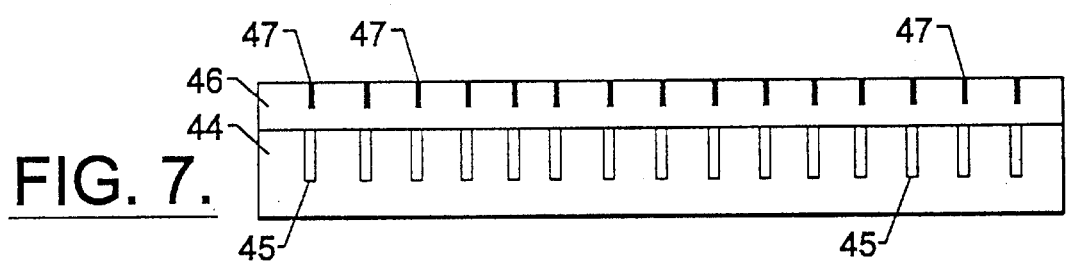
FIG. 7 is a cross-sectional view of the wafer of FIG. 5 and showing in schematic view a buffer layer grown thereon.

FIG. 5 is a schematic view of a wafer that incorporates a plurality of device precursors and that incorporates the stress absorbing structure of the present invention. FIG. 5 illustrates a wafer broadly designated at 44 on which is superimposed a grid pattern of grooves 45. FIG. 6 shows the same wafer 44 and grooves 45 in a cross-sectional orientation. When the next epitaxial layer 46 (FIG. 7) is grown on the wafer 44 with its grooves 45, the surface of the epitaxial layer 46 tends to have a series of discontinuities 47 whose positions reflect the positions of the grooves 45 that form the pattern in the wafer 44. These discontinuities 47 form areas at which stress will relieve itself as the crystal lattice structure of the buffer layer 46 grows on the silicon carbide wafer 44. As a result, such stress resulting from lattice mismatches (or other factors) occurs at intended rather than random positions, thus permitting devices to be formed in the remaining areas without significant risk of stress cracking.

As noted above and illustrated in FIG. 5, in one preferred embodiment the predetermined pattern of stress relieving areas comprises a grid and the grid can preferably be formed in any desired or necessary size that defines individual devices. For example, where the individual devices will be light emitting diodes, a preferable grid pattern defines squares of about 250 microns per side. Alternatively, for different devices such as laser diodes, the grid can define rectangles of about 250 by 500 microns ($\mu$).

Figure 10:
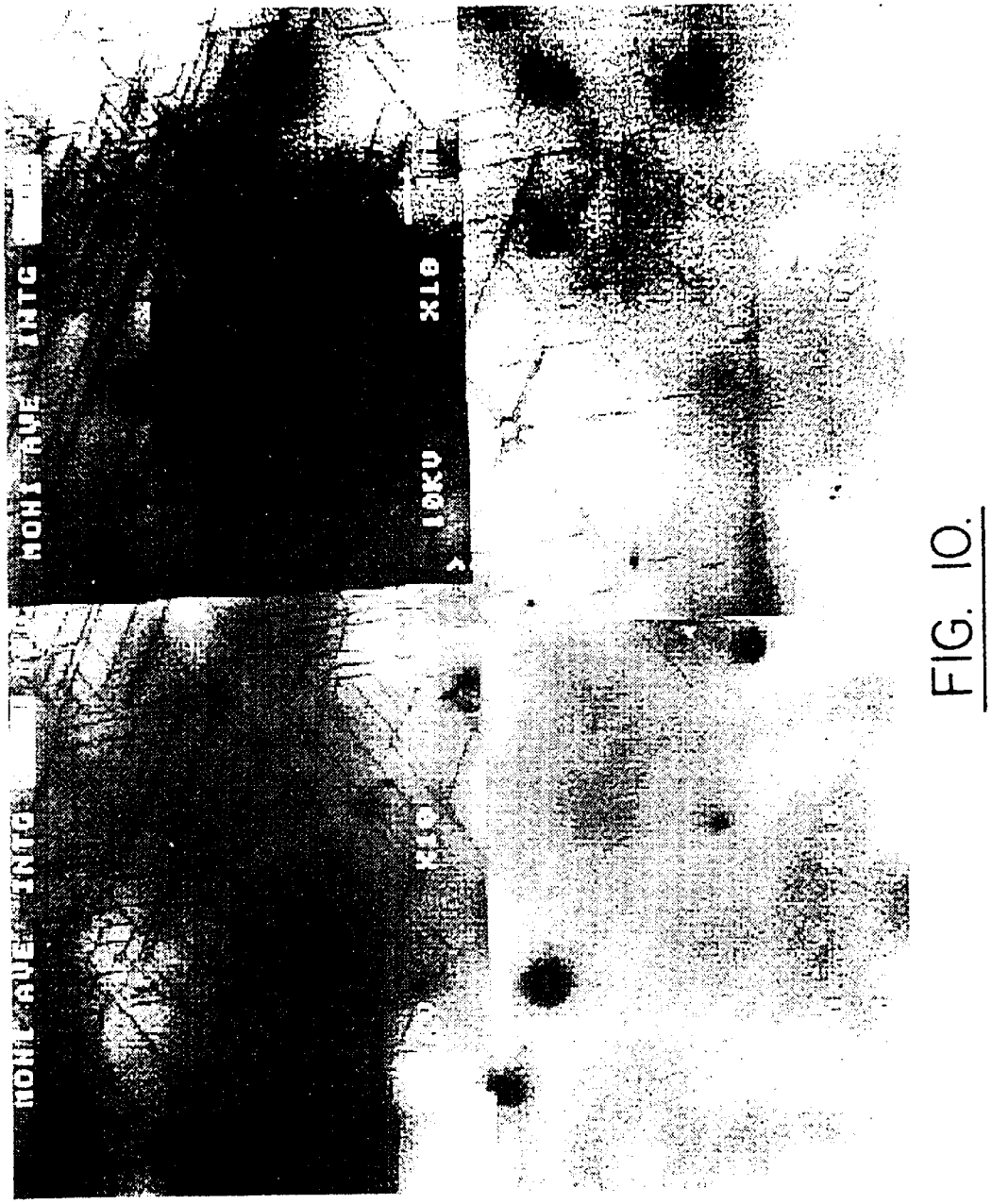
FIG. 10 is a 10× magnification photo from a scanning election microscope (SEM) of an epilayer that does not incorporate the present invention.

FIG. 10 is a SEM photograph taken at a 10× magnification (10 times actual size) that shows the extent to which cracking-seen as the somewhat triangular or hexagonal patterns-can mar an epitaxial layer and render it defective or useless for photonic devices.

Figure 11:
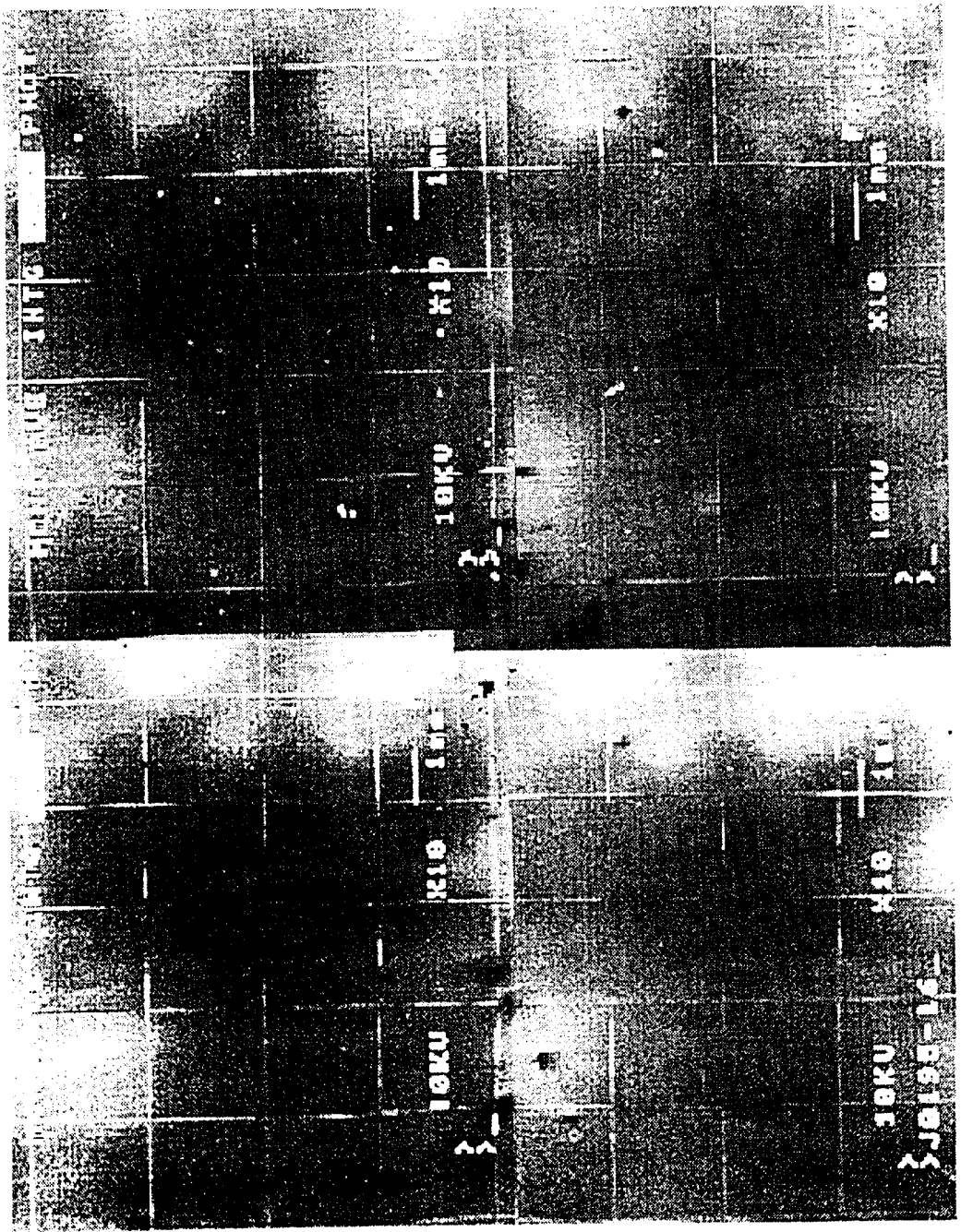
FIG. 11 is an 10× SEM photo showing an epilayer according to the present invention.

FIG. 11 is another 10× SEM photograph and illustrates a grid pattern of grooves in the epitaxial layer. In comparison with FIG. 10, the surface shown in FIG. 11 is relatively free of cracking defects.

Figure 12:
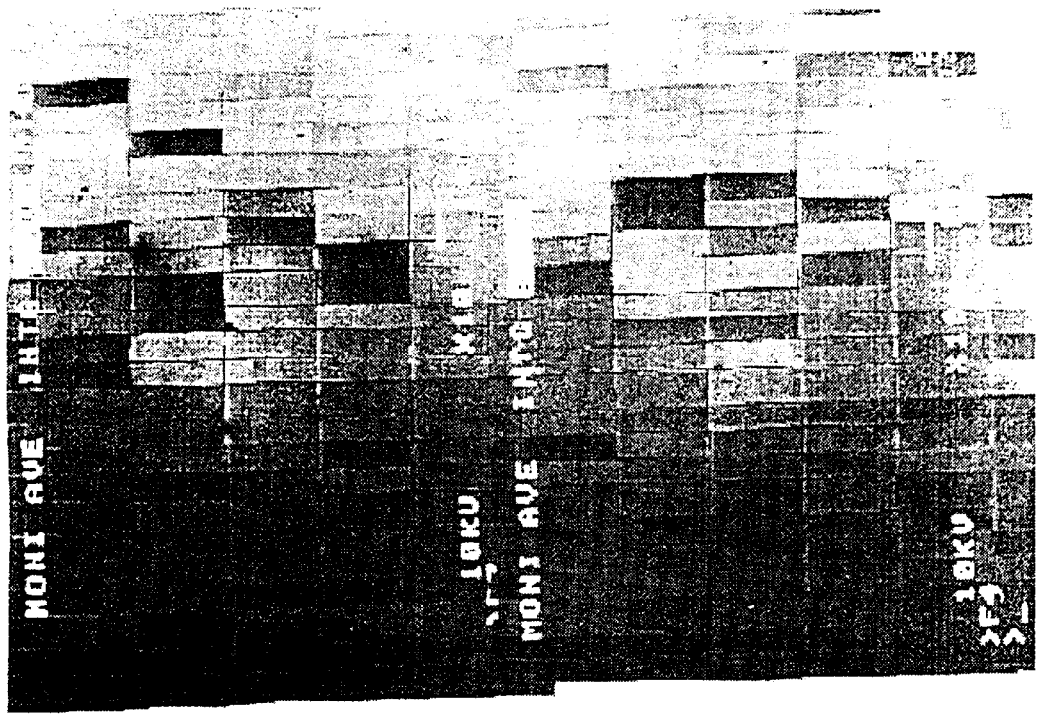
FIG. 12 is another 10× SEM photo showing an epilayer according to the present invention.
Figure 12:
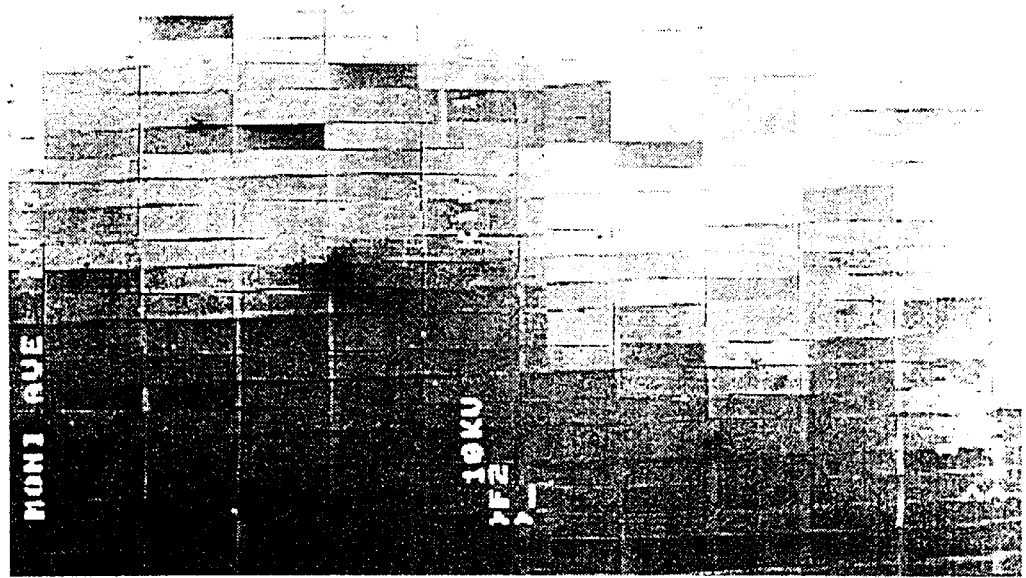

FIG. 12 is another 10× SEM photograph, and illustrates a smaller grid pattern. As with FIG. 11, it is quite free of the cracks illustrated in FIG. 10.

Figure 13:
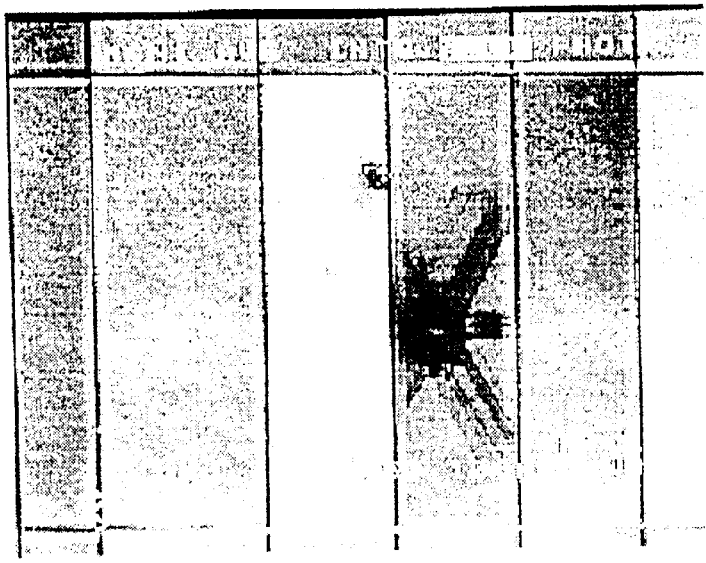
FIG. 13 is a 50× SEM photo of an epilayer similar to FIG. 12.

FIG. 13 is a 50× SEM photograph that particularly illustrates the advantages of the invention. In FIG. 13, one of the grid sections contains a large defect (in a somewhat "X" shape). The defect ends, however, at the grid line and spoils only one device (or device precursor) rather than a multi-device portion of the wafer.

Figure 14:
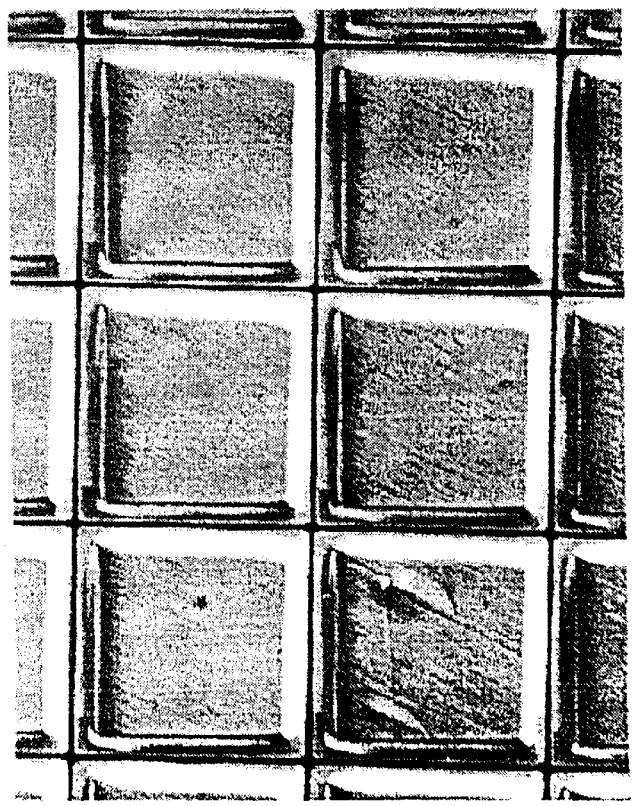
FIG. 14 is a 100× SEM photo of an epilayer according to the present invention.

FIG. 14 is a 100× SEM photograph that similarly illustrates one defective grid portion (in the lower right portion of the photograph) for which the defect ends at the grid line rather than propagating further throughout the surface.

Figure 15:
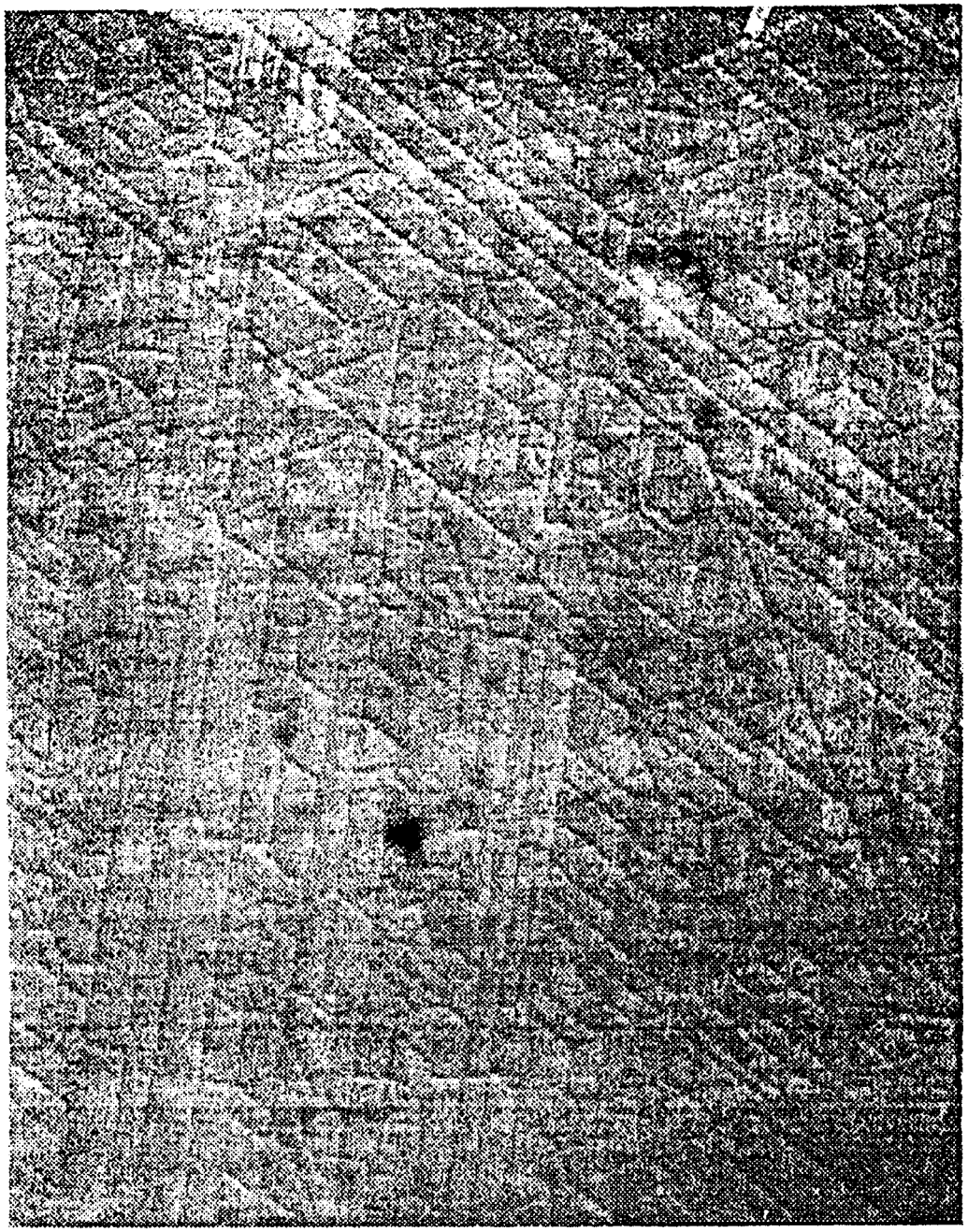
FIG. 15 is another 100× SEM photo showing another epilayer that does not incorporate the present invention.

FIG. 15 is a 100' SEM photograph that again illustrates a surface that does not incorporate any of the embodiments of the present invention. As with FIG. 10, the geometric pattern of defects is quite evident.

Figure 8:
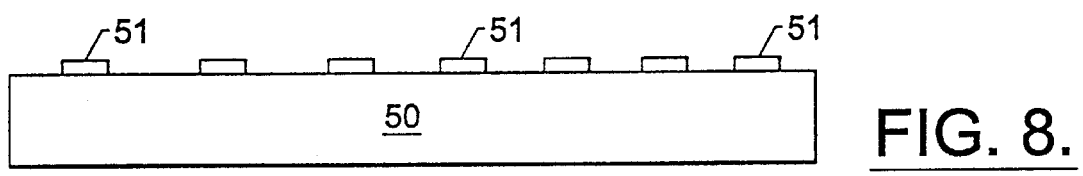
FIG. 8 is a cross-sectional view of a wafer incorporating second embodiment of the invention.
Figure 9:
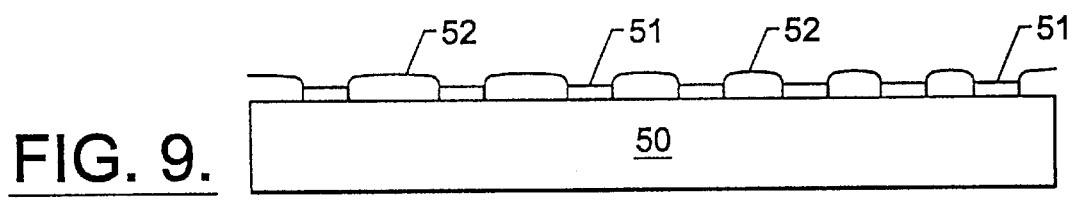
FIG. 9 is a cross-sectional view identical to FIG. 8 but showing additional crystal growth thereon.

In another embodiment, the stress absorbing structure can comprise a predetermined pattern of small mesa structures that are best illustrated in FIGS. 8 and 9. In FIGS. 8 and 9 the silicon carbide substrate is designated at 50 and the small mesa structures at 51. The mesa structures 51 are formed of a material upon which the growth of the selected buffer material is disfavored. For a gallium nitride or indium gallium nitride buffer structure, the preferred materials are selected from the group consisting of silicon dioxide, silicon nitride, and aluminum oxide.

FIG. 9 illustrates the same structure as FIG. 8, but with the buffer material grown as an epitaxial layer on the silicon carbide substrate 50. The epitaxial layer portions are illustrated at 52. As FIG. 9 illustrates, because growth of the buffer material is disfavored on the mesas 51, the epitaxial layer 52 forms a pattern which again exhibits predetermined stress-relieving discontinuity structures therebetween. As in the previous embodiment, the areas between the mesas can be tailored to be about the same size as the individual device, which, as noted above, is on the order of about 250 microns for LEDs and about 250×500$\mu$ for laser diodes. It will be understood, however, that the particular size of the pattern of either the grids or the mesa structures is illustrative rather than limiting of the present invention.

It will be understood that although the wafer structures according to the invention are particularly advantageous for optoelectronic devices, they are not limited to such, and the superior structural properties are advantageous for other devices formed upon the wafers.

As noted in the background portion, the optoelectronic device formed upon the buffer layer, and as typically illustrated at 23 in FIG. 1 and 33 in FIG. 2, is generally not a single layer, but rather is a multi-layer diode selected from the group consisting of p-n homojunctions, p-n heterojunctions, p-n single and double heterojunctions, and p-n junction quantum well structures.

In preferred embodiments, the silicon carbide substrate has a polytype selected from the group consisting of the 3C, 4H, 6H, and 15R polytypes. In the most preferred embodiments, the Group III nitride active layer of the diode comprises gallium nitride or indium gallium nitride.

Figure 16:
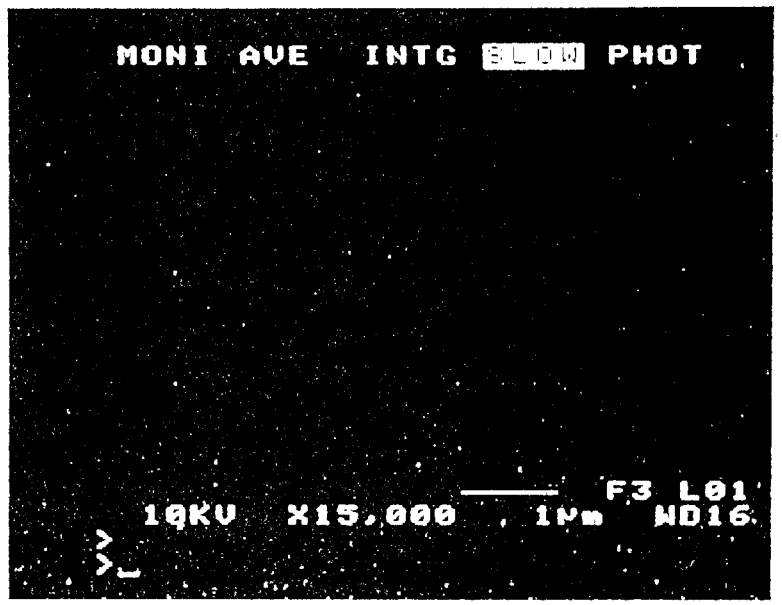
FIGS. 16, is a 15,000× SEM photo of a second embodiment of the invention.
Figure 17:
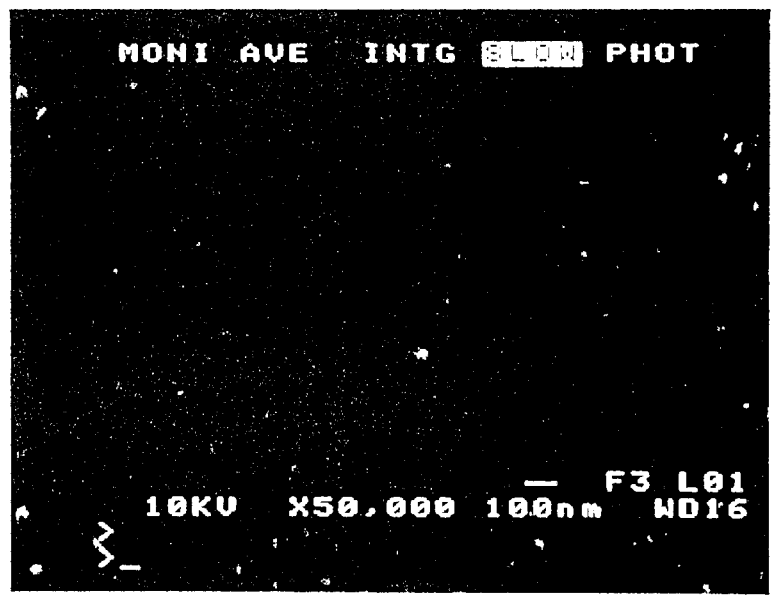
FIG. 17 is a 50,000× SEM photo of the second embodiment.

FIGS. 16 and 17 illustrate another embodiment of the invention. In general, in schematic fashion, the overall structure is again illustrated by FIG. 2 and comprises the silicon carbide substrate 31, the photonic diode 33 and the buffer layer 34. In this embodiment, however, the buffer layer is aluminum gallium nitride rather than gallium nitride or indium gallium nitride. This embodiment includes a plurality of discrete crystal portions that appear as the white colored dots in FIGS. 16 and 17. The discrete crystal portions are selected from the group of gallium nitride and indium gallium nitride and are on the surface of the silicon carbide substrate for minimizing or eliminating the heterobarrier between the silicon carbide substrate 31 and the aluminum gallium nitride buffer structure 34.

In preferred embodiments, the discrete crystal portions are present in an amount sufficient to minimize or eliminate the heterobarrier but less than the amount that would detrimentally affect or destroy the function of any resulting diode device built on the silicon carbide substrate 31. As illustrated in the photographs of FIGS. 16 and 17 the discrete crystal portions are present in an amount of between about 40 and 60 per square micron.

Additionally, the sizes of the discrete crystal portions are preferably large enough to minimize or eliminate the heterobarrier, but smaller than a size that would detrimentally affect or destroy the function of any resulting diode device built on the silicon carbide substrate 31. In preferred embodiments, the discrete crystal portions are between 0.01 and 0.1 microns in diameter.

As in the previous embodiments, the optoelectronic device 33 formed on the buffer structure can comprise a light emitting diode or laser diode, and the resulting light emitting diode can be incorporated into pixels which in turn can be incorporated into displays.

In preferred embodiments, the aluminum gallium nitride buffer layer has an atomic fraction of aluminum of between about 10 and 15%.

In another aspect, the invention comprises the method of producing the Group III nitride optoelectronic device on a silicon carbide substrate with a conductive buffer structure. In its method aspects, the invention comprises forming a structural pattern on the surface of a silicon carbide substrate that has otherwise been prepared for crystal growth thereon; forming a buffer layer selected from the group consisting of gallium nitride and indium gallium nitride on the patterned surface of the silicon carbide substrate so that the buffer layer exhibits features that follow the pattern of openings in the surface of the silicon carbide substrate; and thereafter forming a optoelectronic device with a Group III nitride active layer on the buffer layer.

As described with respect to the structural aspects, the step of forming the structural pattern can comprise forming a pattern of openings in the surface of the silicon carbide substrate or forming a pattern of mesa structures on the surface of the silicon carbide substrate.

When the pattern is formed of openings, the step of forming the openings can comprise techniques such as reactive ion etching or masking and etching steps. Each of these steps is relatively well understood for silicon carbide and will not be otherwise described except to note, for example, U.S. Pat. Nos. 4,865,685 and 4,981,551 describe exemplary dry etching procedures for silicon carbide.

Where the mesa structures are incorporated, they are preferably selected from the group consisting of silicon dioxide, silicon nitride, and aluminum oxide. As in the structural environments, the optoelectronic device with the Group III active layer is preferably formed of gallium nitride or indium gallium nitride.

As in the structural embodiments, the method of the invention can comprise forming a light emitting diode or a laser diode, and when a light emitting is formed, the method can further comprise incorporating the LED into a pixel, and the pixel into a display.

In an alternative method aspect, the buffer structure of the invention structure is formed of aluminum gallium nitride on a silicon carbide substrate that has been previously prepared by forming a plurality of discrete crystal portions selected from the group consisting of gallium nitride and indium gallium nitride on the silicon carbide surface. Thereafter, the optoelectronic device with the Group III nitride active layer is formed on the buffer layer.

As set forth in the structural aspects of the invention, the method comprises forming discrete crystal portions of a size and in an amount that is sufficient to minimize or eliminate the heterobarrier, but less than sizes or amounts that would detrimentally affect or destroy the function of any resulting diode device built on the silicon carbide substrate. In particular the invention provides a robust structure that can withstand normally expected levels of electrostatic discharge.

In the second method aspect, the resulting device can be formed as a light emitting diode so that the method can further comprise incorporating the LED pixel and the pixel into a display. The method can alternatively comprise forming a laser diode rather than an LED.

As in the other aspects of the invention, when the aluminum gallium nitride buffer layer is used, it is preferably has an atomic fraction of aluminum of between about 10 and 15%.

EXAMPLE

In a current process for producing conductive buffer LEDs and Laser Diodes, GaN dots are first deposited. The purpose of the GaN dots is to decrease the barrier between the SiC substrate and the Si-doped AlGaN buffer layer. This is done at considerably lower temperatures than are used for the other epitaxial layers in the structure. The size and density of the dots are shown in FIGS. 16 and 17. It is important to keep the dots relatively small so the electrostatic discharge will not be adversely affected. The GaN dots are deposited in about 6 seconds, and then "capped" with Si-doped $Al_{0.10}Ga_{0.90}N$ for about 15 seconds. The purpose of this cap is to prevent the dissociation of the GaN dots upon heating. In this material system, adding any Al to GaN, i.e., $Al_{(1-x)}Ga_{(x)}N$ decreases the dissociation rate of the material because AlGaN is more stable than GaN in an $NH_3/H_2$ atmosphere. After the capping of the dots, the temperature is then ramped up to the buffer layer temperature. Temperatures are allowed to stabilize for 2 minutes after the ramp before commencing buffer layer growth.

In a specific run, a SiC wafer is heated in an atmosphere of $NH_3$ and $H_2$, at 13 SLM and 15 SLM, respectively. These flows remain constant throughout the growth of the GaN dots, the AlGaN cap, and the subsequent buffer layer. The temperature ramps up over the course of 10 minutes until the GaN dot temperature is reached which is about 960° C. After allowing the temperature in the system to stabilize for approximately 5 minutes, the dots are deposited by flowing 10–15 cc of trimethyl gallium (TMG; −5° C., 600 torr) for about 6 seconds. In order to ensure that the dots are conducting, $SiH_4$ is also added with the TMG flow. The amount of $SiH_4$ is determined by growing a bulk GaN layer with a carrier concentration of about $1\times10^{18}$ $cm^{-3}$. Immediately following the deposition of the GaN dots, the TMG and $SiH_4$ continue to flow, but now with the addition of trimethyl aluminum (TMA, 92 cc, 25° C., 600 torr). This leads to a "cap" of about 10–11% AlGaN. The growth time of the cap is 15 seconds. The flows (TMG, TMA, and $SiH_4$) are then terminated and the temperature is ramped to the buffer temperature which is typically around 1060° C. The temperature ramp is 1 minute and is followed by a 2 minute period during which the temperature is allowed to stabilize. The buffer layer is then grown. Typical conditions are 18 cc TMG/110 ccTMA/.087 cc $SiH_4$. Buffer layers consist of approximately 11–12% AlGaN and are typically between about 1600 and 2700 Å thick.

In the drawings and specification, there have been disclosed typical embodiments of the invention, and, although specific terms have been employed, they have been used in a generic and descriptive sense only and not for purposes of limitation, the scope of the invention being set forth in the following claims.

That which is claimed is:

1. An optoelectronic device with a Group III Nitride active layer, said device comprising:

a conductive silicon carbide substrate;

an ohmic contact to said substrate;

an optoelectronic diode with a Group III nitride active layer;

a buffer structure selected from the group consisting of gallium nitride and indium gallium nitride between said silicon carbide substrate and said optoelectronic diode; and a stress-absorbing structure comprising a predetermined pattern of small mesa structures on said substrate formed of a material upon which the growth of the selected buffer material is disfavored, and a pattern of predetermined stress-relieving areas propagated from said substrate into the crystal structure of said buffer structure, so that stress-induced cracking that occurs in said buffer structure occurs at said predetermined areas rather than elsewhere in said buffer structure.

2. An optoelectronic device according to claim 1 wherein said buffer structure is conductive.

3. An optoelectronic device according to claim 1 comprising a light emitting diode.

4. A pixel that incorporates a light emitting diode according to claim 3.

5. A display that incorporates a plurality of pixels according to claim 4.

6. An optoelectronic device according to claim 1 comprising a laser diode.

7. An optoelectronic device according to claim 1 wherein said diode is selected from the group consisting of p-n homojunctions, p-n single and double heterojunctions, and p-n quantum junction well structures.

8. An optoelectronic device according to claim 1 wherein said silicon carbide substrate has a polytype selected from the group consisting of the 3C, 4H, 6H, and 15R polytypes.

9. An optoelectronic device according to claim 1 wherein said Group III nitride active layer comprises gallium nitride.

10. An optoelectronic device according to claim 1 wherein said Group III nitride comprises indium gallium nitride.

11. An optoelectronic device according to claim 1 wherein said small mesa structures are selected from the group consisting of silicon dioxide (SiO2), silicon nitride, and aluminum oxide.

12. A wafer precursor for Group III nitride devices, said precursor wafer comprising:

a silicon carbide substrate wafer;

a buffer layer on said substrate and selected from the group consisting of gallium nitride and indium gallium nitride; and a stress-absorbing structure comprising a predetermined pattern of small mesa structures on said substrate formed of a material upon which the growth of the selected buffer material is disfavored, and a pattern of predetermined stress-relieving areas propagated from said substrate into the crystal structure of said buffer structure, so that stress-induced cracking that occurs in said buffer structure occurs at said predetermined areas rather than elsewhere in said buffer structure.

13. A wafer precursor according to claim 12 wherein said small mesa structures are selected from the group consisting of silicon dioxide ($SiO_2$), silicon nitride, and aluminum oxide.

14. A wafer precursor according to claim 12 wherein said silicon carbide substrate has a polytype selected from the group consisting of the 3C, 4H, 6H, and 15R polytypes.

* * * * *